United States Patent
Komagata

(10) Patent No.: US 6,797,637 B2
(45) Date of Patent: Sep. 28, 2004

(54) SEMICONDUCTOR DEVICE FABRICATION METHOD

(75) Inventor: Shogo Komagata, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/300,869

(22) Filed: Nov. 21, 2002

(65) Prior Publication Data

US 2003/0216031 A1 Nov. 20, 2003

(30) Foreign Application Priority Data

May 14, 2002 (JP) ........................................ 2002-138042

(51) Int. Cl.[7] .............................................. H01L 21/302
(52) U.S. Cl. ...................................... 438/706; 438/725
(58) Field of Search ............................... 438/240, 396, 438/689, 694, 761, 785; 257/310, 410, 411, 710–725

(56) References Cited

U.S. PATENT DOCUMENTS

| | | |
|---|---|---|
| 5,188,704 A | 2/1993 | Babie et al. |
| 5,431,772 A | 7/1995 | Babie et al. |
| 6,417,083 B1 | 7/2002 | Mori |
| 6,451,647 B1 * | 9/2002 | Yang et al. ................. 438/240 |
| 2001/0036732 A1 | 11/2001 | Yoshida et al. |
| 2003/0029835 A1 * | 2/2003 | Yauw et al. .................. 216/67 |

FOREIGN PATENT DOCUMENTS

| | | |
|---|---|---|
| EP | 163-691 A2 | 12/2000 |
| JP | 3-145725 | 6/1991 |
| JP | 10303180 | 11/1998 |
| JP | 2000-133633 | 5/2000 |
| JP | 2001-208497 | 7/2000 |
| JP | 2001-3185 | 1/2001 |
| JP | 2001-308076 | 11/2001 |

* cited by examiner

Primary Examiner—Dung A. Le
(74) Attorney, Agent, or Firm—Volentine Francos, PLLC

(57) ABSTRACT

During etching of a BARC film, etching gas is used in which $O_2$, $Cl_2$ and He are mixed in appropriate flow volume ratios, and an appropriate ion energy is set. Thus, a selectivity ratio with respect to an underlying film, which is a SiN film, can be sufficiently assured and a pattern is formed uniformly. During etching of a SiN film, etching gas is used in which HBr, $CH_4$ and He are mixed in appropriate flow volume ratios, and an appropriate ion energy is set. Thus, the form of a pattern is consistent regardless of high- and low-density portions.

15 Claims, 16 Drawing Sheets

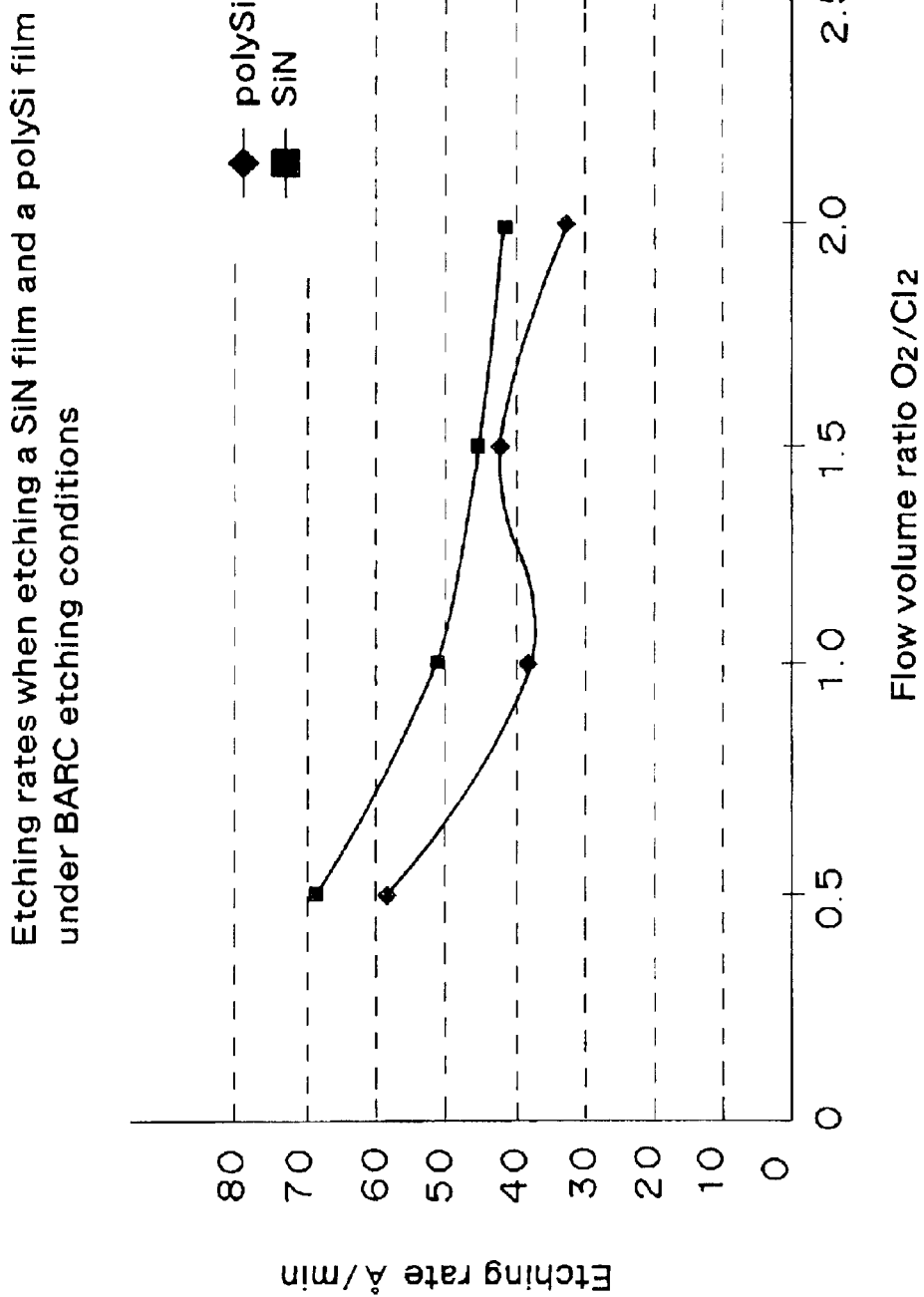

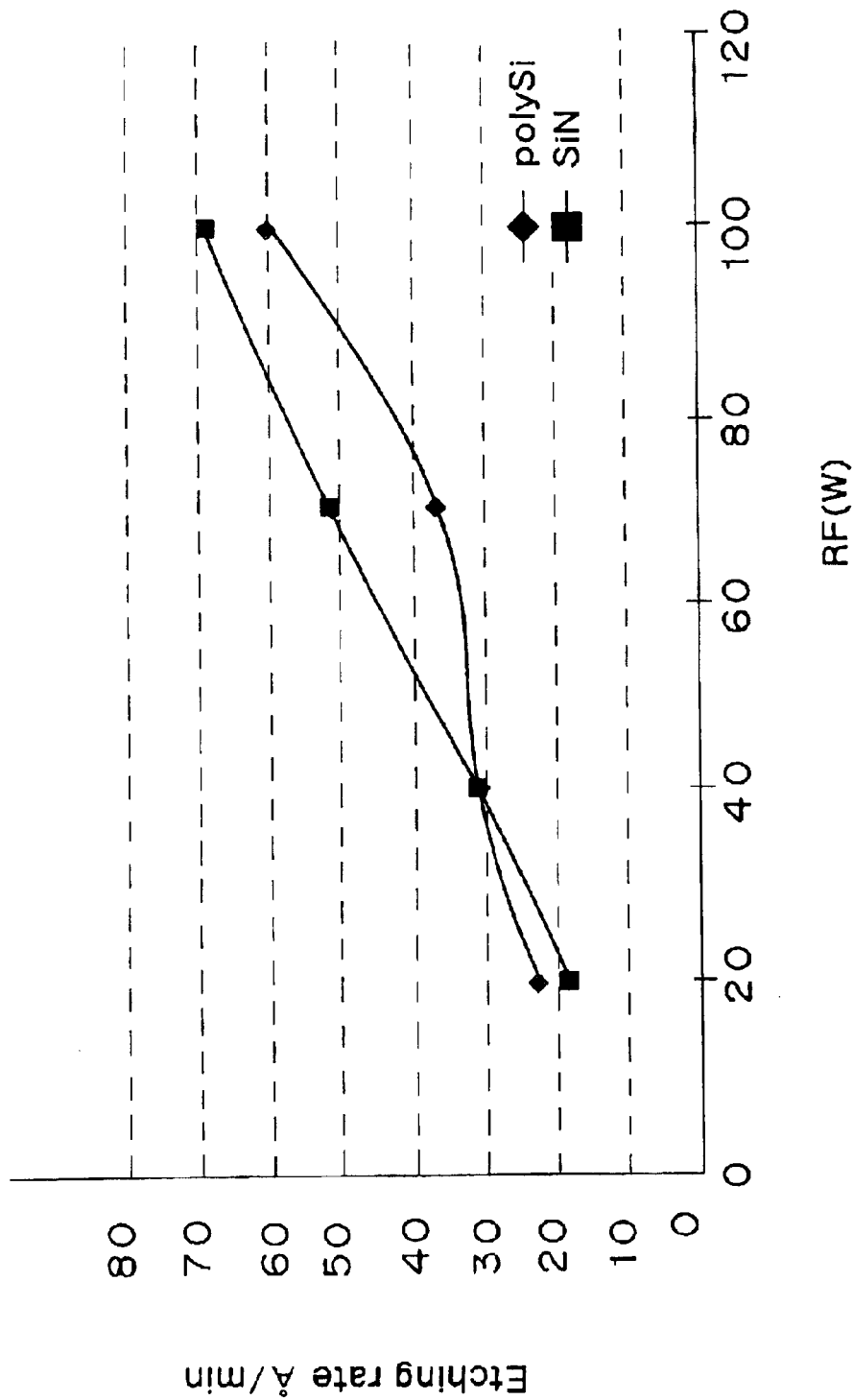

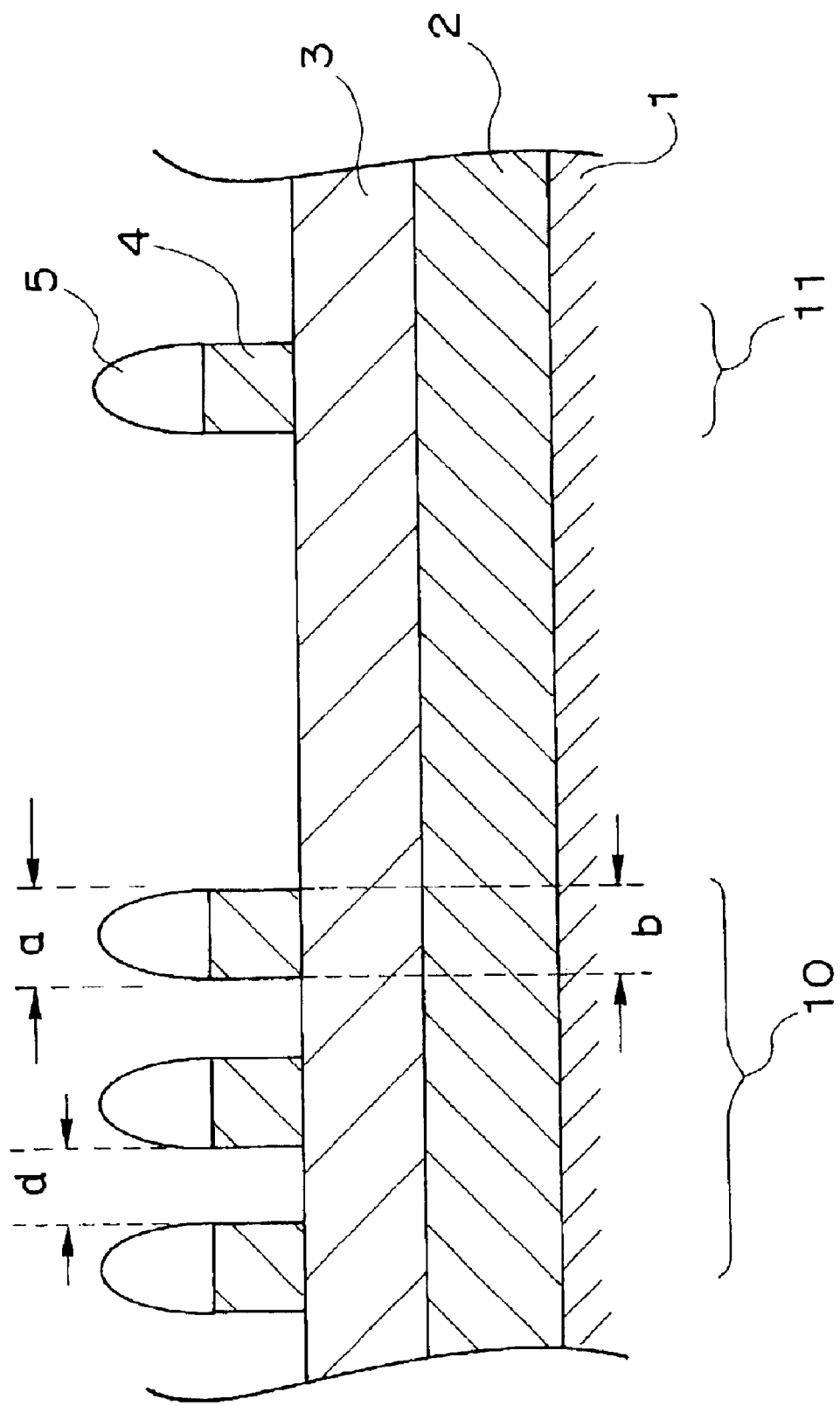

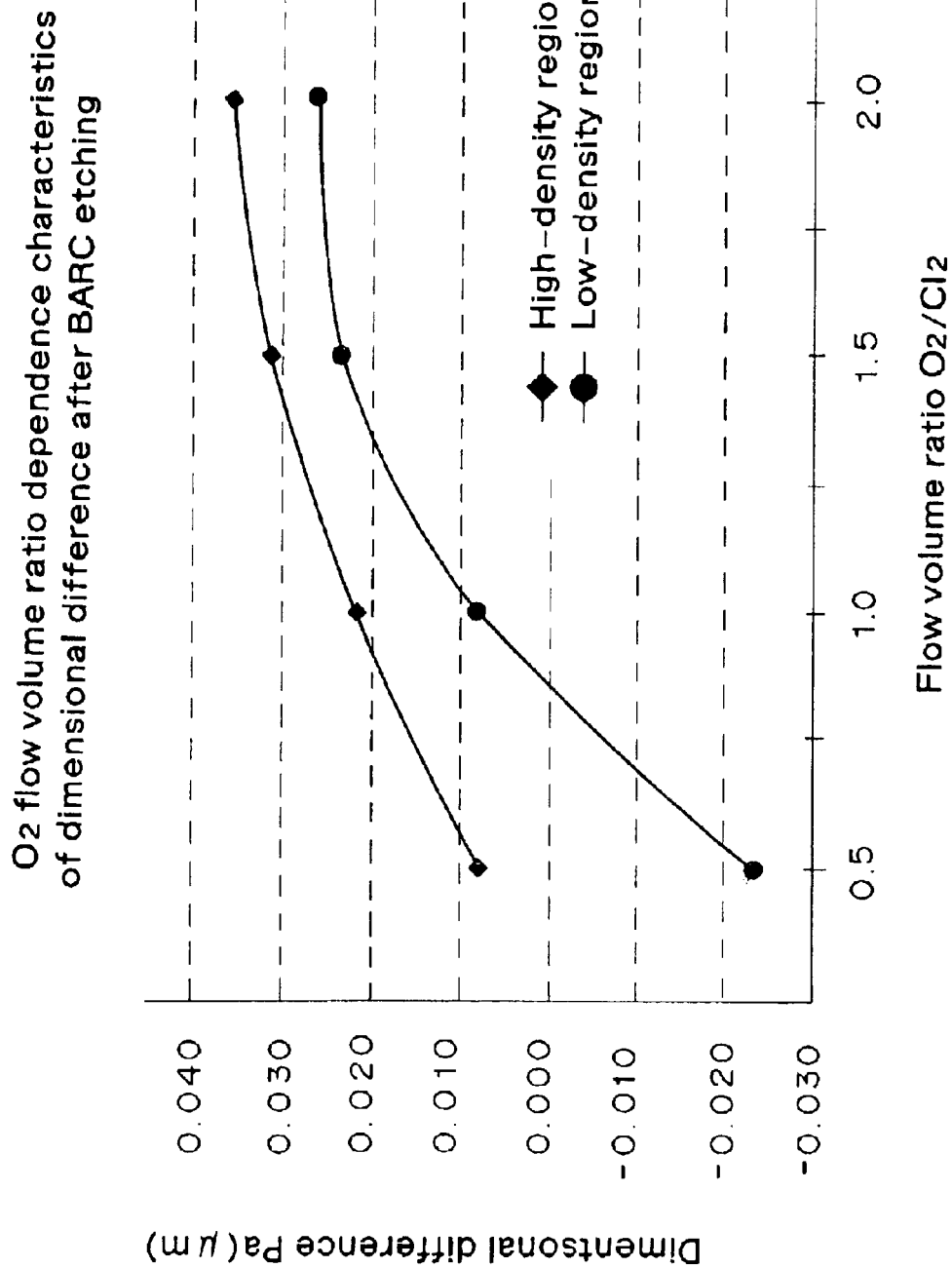

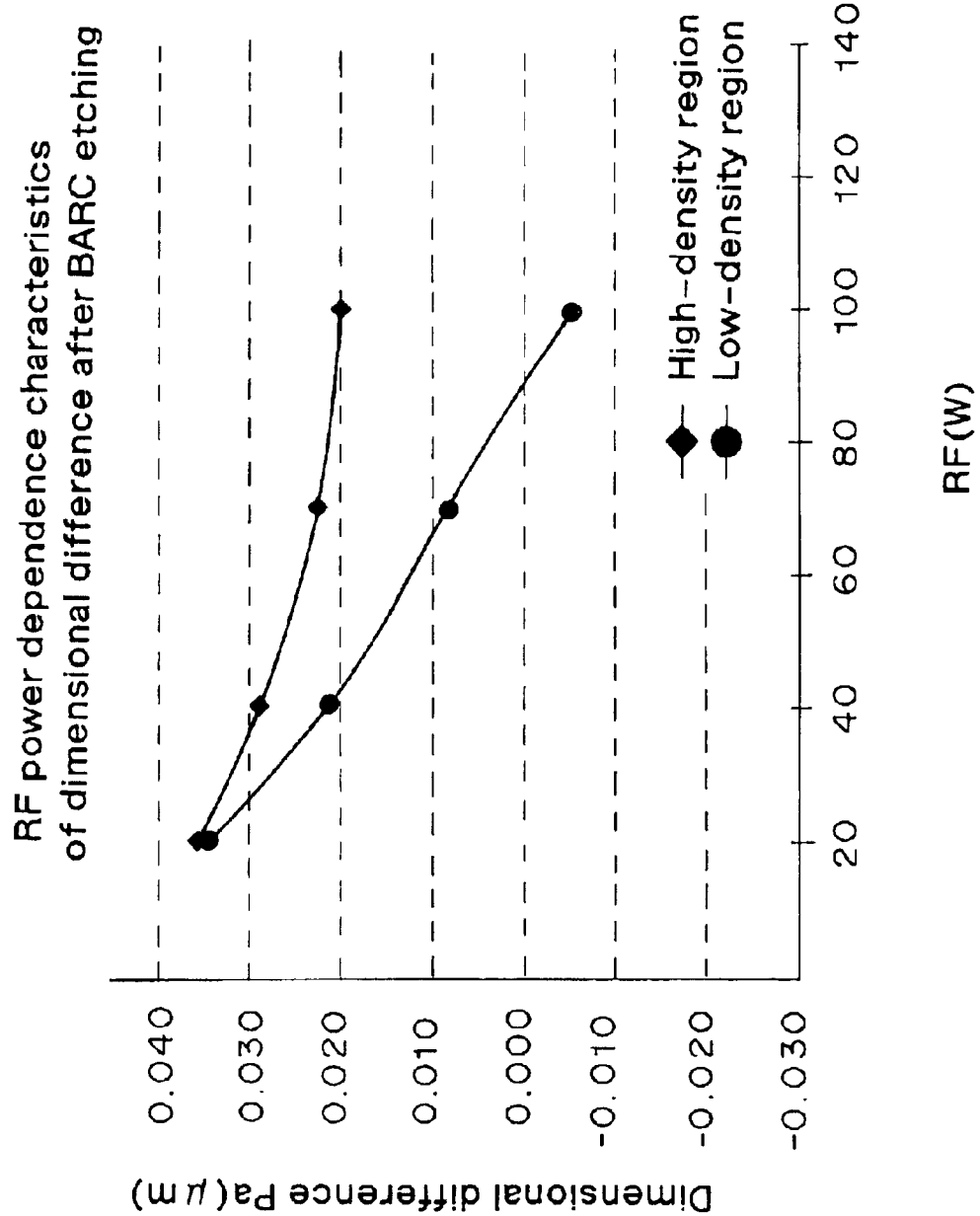

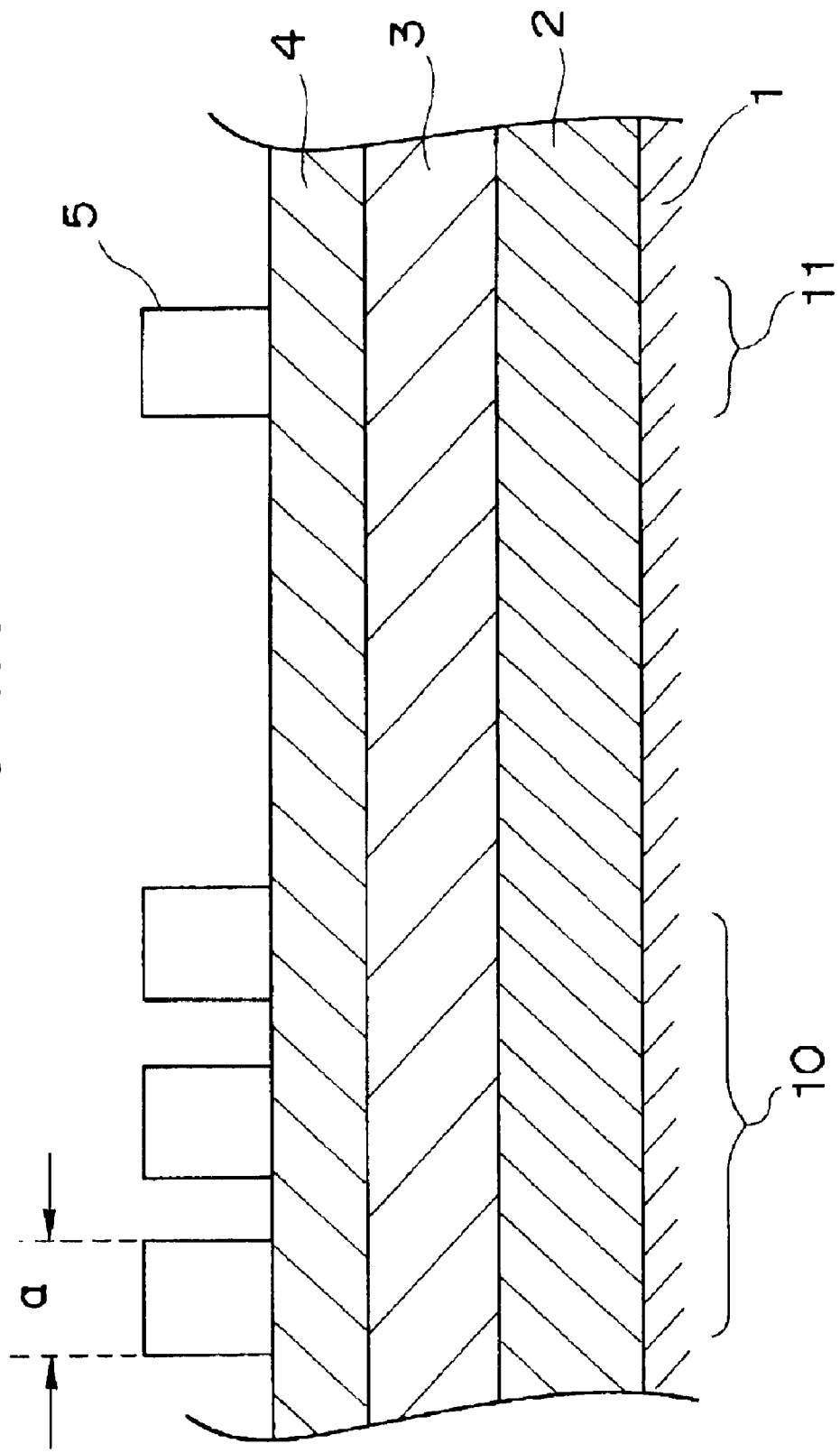

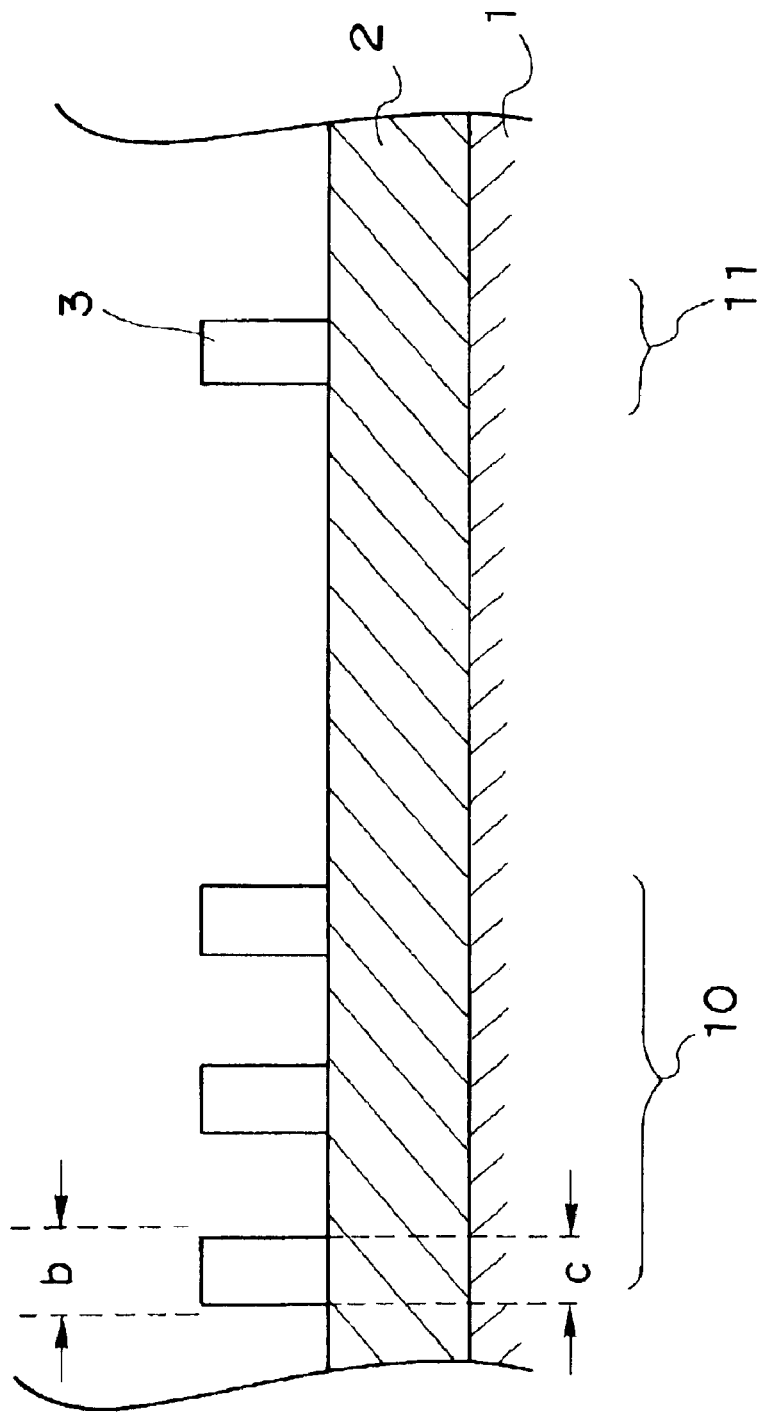

RF power dependence characteristics of dimensional difference after SiN etching

HBr flow volume ratio dependence characteristics of dimensional difference after SiN etching

SEMICONDUCTOR DEVICE FABRICATION METHOD

BACKGROUND OF THE INVENTION

1. Field of the Invention

The present invention relates to a method for fabricating a semiconductor device, and more particularly to a method for accurately etching a SiN film and a BARC film.

2. Description of the Related Art

Conventionally, a method of dry-etching with a gas including $CF_4$, $CHF_3$, $O_2$ and Ar has been proposed as a method for etching a BARC (bottom anti-reflective coating) film formed on an underlying SiN film.

FIGS. 12 to 14 are diagrams showing variations in cross-section of a gate structure having a step. In the case shown, the BARC film is formed at a predetermined portion in the gate structure by dry-etching with the aforementioned method.

In this gate structure, the step is formed, as shown in FIG. 12, by layering a polySi film 102, a WSi film 103, a SiN film 104 and a BARC film 105, in this order, on a substrate 100 at which a LOCOS (local oxidization of silicon) region 101 is formed. When the BARC film is etched with the aforementioned gas, a BARC residue 105' at a step depression portion is generated in the etching process, as shown in FIG. 13.

The SiN film 104 is a hard mask for protecting the underlying films (i.e., the polySi film 102 and the WSi film 103). When over-etching is performed in order to remove the BARC residue 105', an etching amount is 1.8 times as that of the BARC film. Consequently, as shown in FIG. 14, a portion of the etched SiN film 104' that is protected by the BARC residue 105' at the step depression portion is thicker than other parts of the SiN film 104'. Thus, the thickness of the SiN film 104' becomes non-uniform. In this case, portions of the SiN film 104' that are not protected by the BARC residue 105' become excessively thin due to the etching.

In the circumstances described above, when further etching is performed on the SiN film 104', because there are large variations in the thickness of the SiN film 104', it is difficult to reliably perform subsequent etching of the underlying films with high accuracy, even if a selectivity ratio relative to the underlying films is adequate.

FIG. 15 is a diagram which schematically shows the form of a pattern in the case of formation by a usual hard mask etching process of the prior art, that is, a process of using etching gas of $CHF_3/O_2/Ar$ with flow rates of 20/5/400 (SCCM) in a magnetron RIE (reactive ion etching) device, and then performing etching of an $SiN/SiO_2$ film 111, which is a hard mask for protecting a polySi film 110, under etching conditions of: substrate RF power=500 W; pressure=40 mTorr; and electrode temperature=40° C.

As is shown in FIG. 15, the SiN film is etched substantially vertically at high-density pattern portions having a high degree of integration, such as, for example, cell portions for a DRAM. However, low-density pattern portions, peripheral portions and the like, which gas that tends to cause deposition can easily enter, become tapered due to the effect of deposition material. Thus, there is a problem in that lateral dimensions vary in relation to density variations of the pattern.

SUMMARY OF THE INVENTION

A main object of the present invention is to provide a semiconductor device fabrication method which, at a time of etching a BARC film, can increase an etching selectivity ratio of underlying films and enables optimal etching regardless of a degree of density variation of a pattern, and which, at a time of hard mask etching of a SiN film or the like, enables optimal etching regardless of the degree of density variation of the pattern.

According to a first aspect of the present invention, in a semiconductor device fabrication method which includes etching a BARC film disposed with an underlying SiN or polySi film, the etching of the BARC film includes dry-etching the BARC film with etching gas in which at least $O_2$, $Cl_2$ and He are mixed with predetermined flow volume ratios; and when an etching selectivity ratio of the BARC film relative to the underlying film is to be made larger, increasing the flow volume ratio of $O_2$ relative to $Cl_2$.

According to a second aspect of the present invention, in a semiconductor device fabrication method which includes etching a BARC film disposed with an underlying SiN or polySi film, the etching of the BARC film includes dry-etching the BARC film with etching gas in which at least $O_2$, $Cl_2$ and He are mixed with predetermined flow volume ratios; and when an etching selectivity ratio of the BARC film relative to the underlying film is to be made larger, reducing ion energy at the time of etching.

According to a third aspect of the present invention, in a semiconductor device fabrication method which includes etching a BARC film disposed with an underlying SiN or polySi film, the step of etching the BARC film includes dry-etching the BARC film with etching gas in which at least $O_2$, $Cl_2$ and He are mixed with predetermined flow volume ratios; and setting the flow volume ratio of $O_2$ relative to $Cl_2$ in the etching gas to at least 1.

According to a fourth aspect of the present invention, in a semiconductor device fabrication method which includes etching a SiN film, the etching of the SiN film includes: at the time of etching the SiN film, using etching gas in which HBr, $CF_4$ and He are mixed in predetermined flow volume ratios; and setting ion energy at the time of etching in a range from 13 eV to 30 eV.

BRIEF DESCRIPTION OF THE DRAWINGS

FIG. 2 is a graph showing variation characteristics of etching rates when etching a SiN film and a polySi film under BARC etching conditions.

FIG. 3 is a graph showing variation characteristics of etching rates when etching a SiN film and a polySi film under other BARC etching conditions.

FIG. 4 is a sectional diagram schematically showing principal structure of a semiconductor device for implementing a fabrication method of a second embodiment in accordance with the fabrication method of the present invention.

FIG. 5 is a graph showing $O_2$ flow dependence characteristics of a dimensional difference Pa resulting from BARC etching.

FIG. 6 is a graph showing RF power dependence characteristics of a dimensional difference Pa resulting from BARC etching.

FIGS. 7A and 7B are diagrams schematically showing relevant structure of a semiconductor device for explaining a fabrication method of a fourth embodiment in accordance with the fabrication method of the present invention.

DESCRIPTION OF THE PREFERRED EMBODIMENTS

First Embodiment

Figure 1:
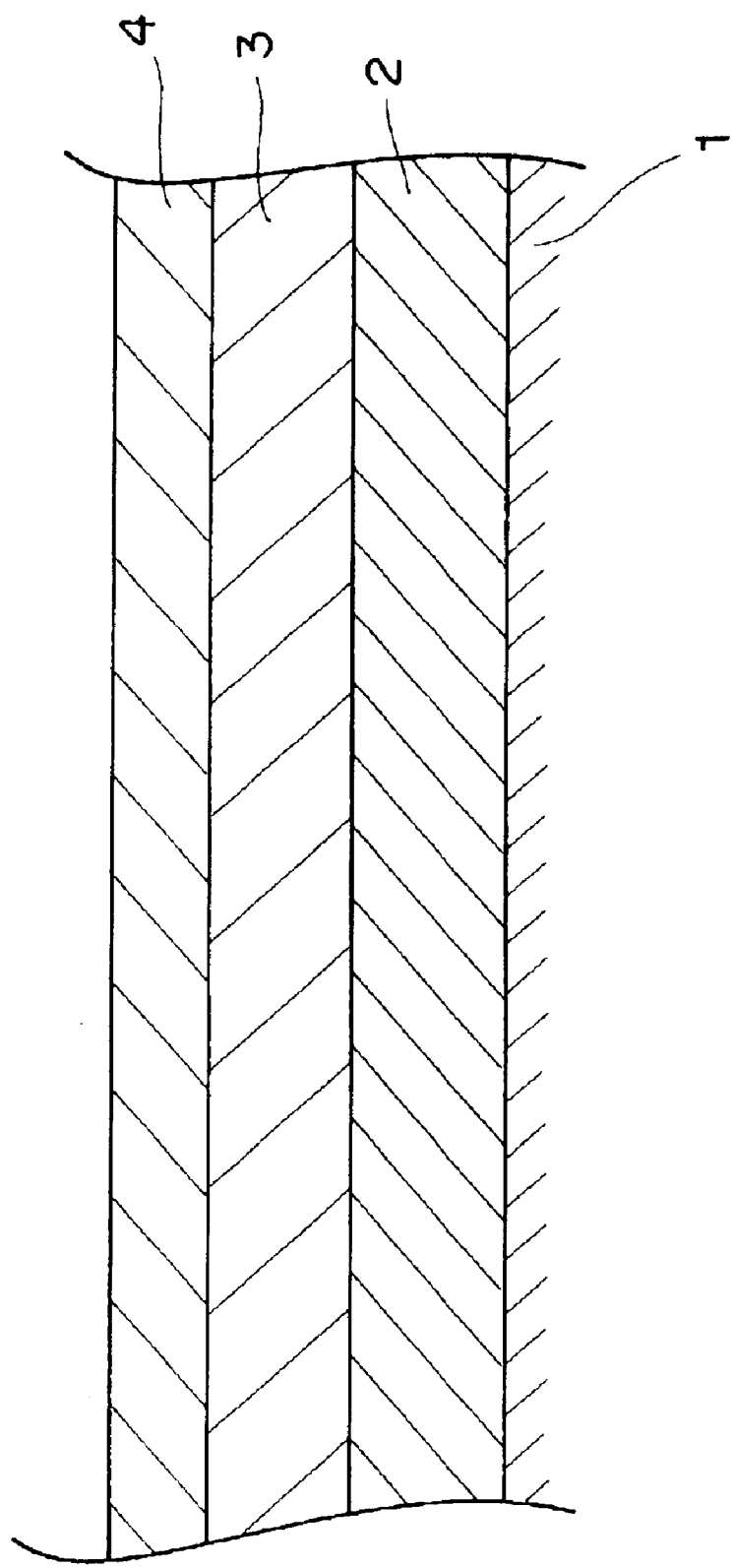
FIG. 1 is a sectional diagram showing a cross-section of relevant layers of a semiconductor device for implementation of a fabrication method of a first embodiment in accordance with the fabrication method of the present invention.

FIG. 1 is a sectional diagram showing a cross-section of relevant layers of a semiconductor device for explaining a fabrication method of a first embodiment in accordance with a fabrication method of the present invention.

As shown in FIG. 1, a polySi (polysilicon) film 2, which serves as a wiring material, is formed on a substrate 1 by a CVD (chemical vapor deposition) process. A SiN film 3 is formed on the polySi film 2 by the same CVD process. Then, a BARC film 4, which is a reflection prevention film used as a mask when forming a resist pattern for photolithography, is formed on the SiN film 3.

At a region of the semiconductor device shown in FIG. 1, the whole of the BARC film 4 is to be removed by dry-etching.

A fabrication method of the first embodiment illustrates a method of dry-etching the BARC film 4 with gas, so as to hardly at all etch the SiN film 3 or polySi film 2 thereunder.

In the first embodiment, an etching gas used when dry-etching the BARC film 4 includes at least $O_2$ and $Cl_2$. For example, the dry-etching may be performed under the following etching conditions.

Use of an ICP (inductively coupled plasma) etching apparatus:
Pressure=5 mTorr;
Gas flow: $Cl_2/O_2/He$=20/20/60 (sccm), 100 sccm in total;
Source power=250 W;
Bottom power=80 W;
Electrode temperature=60° C.;
Over-etching=50%.

Based on the above etching conditions, an etching rate of the BARC film 4 is of the order of 3700 Å/min. However, removal of the underlying SiN film 3 by the etching is practically undetectable.

FIG. 2 shows measurements of each etching rate for separate etching of a SiN film and a polySi film with different flow rates of $O_2$ relative to $Cl_2$, under the following conditions for a BARC film etching rate of around 3500 Å/min.

These etching conditions are:
Use of an ICP (inductively coupled plasma) etching apparatus;
Pressure=5 mTorr;
Source power=250 W;
Bottom power=70 W;
Electrode temperature=60° C.;
Gas flow: $Cl_2/O_2/He$=20/(10 to 40)/(70 to 40) (sccm), total flow 100 sccm (fixed).

In this case, as shown in FIG. 2, when the flow volume ratio ($O_2/Cl_2$) of $O_2$ relative to $Cl_2$ in the etching gas changes, there are slight variations in an etching rate of the SiN film or polySi film, and this etching rate is in a range from 30 Å/min to 70 Å/min.

Accordingly, an etching selectivity ratio of the BARC film relative to the SiN film and the polySi film is around 50 to 100. Therefore, even if over-etching is set to 50% (corresponding to 9 seconds) when the BARC film is being etched, etching of an underlying film, the SiN film or the polySi film, can be suppressed to a removal amount of 10 Å or less.

FIG. 3 shows measurements of each etching rate for separate etching of a SiN film and a polySi film with different values of bottom power, under the following conditions for a BARC film etching rate of around 3500 Å/min. These etching conditions are:
Use of an ICP (inductively coupled plasma) etching apparatus;
Pressure=5 mTorr;
Gas flow: $Cl_2/O_2/He$=20/20/60 (sccm);
Source power=250 W;
Bottom power=20 to 100 W;
Electrode temperature=60° C.

In this case, as shown in FIG. 3, when a substrate RF (radio frequency) power, which corresponds to the bottom power, changes, there are slight variations in the etching rate of the SiN film or polySi film, and this etching rate is in a range from 20 Å/min to 70 Å/min.

Accordingly, an etching selectivity ratio of the BARC film relative to the SiN film and the polySi film is around 50 to 170. Therefore, even if over-etching is set to 50% (corresponding to 9 seconds) when the BARC film is being etched, etching of an underlying film, which is the SiN film or the polySi film, can be suppressed to a removal amount of 10 Å or less.

Figure 10:
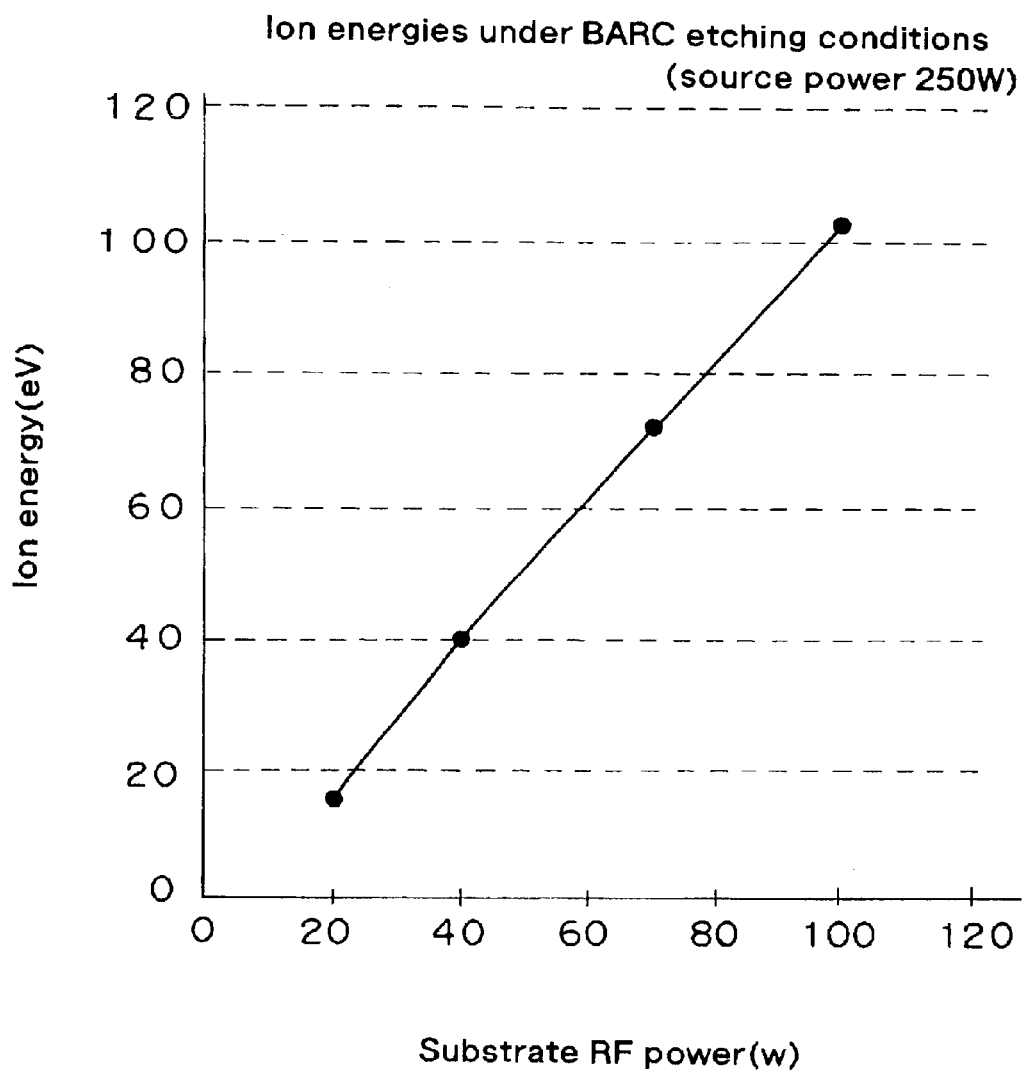
FIG. 10 is a graph showing a relationship between substrate RF power and ion energy during BARC film etching by an ICP etching apparatus using a present embodiment.

FIG. 10 shows results of measurements of a relationship between substrate RF power and ion energy during BARC etching with an ICP etching apparatus using the present embodiment.

An ion energy also varies with RF frequency, and decreases in correspondence to an increase in frequency. The ion energy further depends on a source power for generating plasma, and tends to decrease as the source power is raised. The source power and the RF frequency have the same values as in the BARC etching mentioned above. That is, measurements were taken with RF frequency=13.56 MHz and source power=250 W.

As can be clearly seen from FIG. 10, the ion energy (eV) increases substantially in proportion to the RF power (W). Therefore, setting of the ion energy to a desired value at a time of etching can be performed by adjusting the substrate RF power of the ICP etching apparatus.

As described above, according to the fabrication method of the first embodiment, gas including $O_2$ and $Cl_2$ is used during the BARC etching. Therefore, a selectivity ratio with respect to SiN of an underlying film is increased, and high accuracy etching can be performed consistently with respect to the underlying film.

Moreover, the etching selectivity ratio of the BARC film can be made even greater by increasing the flow volume ratio of $O_2$ in the etching gas and/or by reducing the ion energy during etching.

Second Embodiment

FIG. 4 is a sectional diagram schematically showing principal structure of a semiconductor device for explaining a fabrication method of a second embodiment according to the semiconductor device fabrication method of the present invention.

As shown in FIG. 4, the polySi film 2, the SiN film 3, and the BARC film 4 are formed in this order on the substrate 1, similarly to the first embodiment. In addition, a resist pattern 5 is formed on the BARC film 4 by photolithography.

FIG. 4 shows a structure of steps after dry-etching of the BARC film 4 with the resist pattern 5 serving as a mask formed by photolithography.

A pattern width a represents a pattern width of the resist pattern formed by photolithography. A pattern width b represents a pattern width of a BARC pattern at the steps after dry-etching of the BARC film 4, at a lower face portion of the BARC film 4. Further, a high integration region 10 represents a region at which the patterns are densely integrated such that the spacing between adjacent patterns is equal to or less than about 0.3 μm. In contrast, a low-density region 11 represents a region at which the patterns are formed apart from each other such that the etching of the pattern is not effected by the presence of the adjacent pattern.

In the present embodiment, the BARC film is dry-etched using a gas which includes at least $O_2$ and $Cl_2$ as an etching gas. Details thereof are explained in further detail below, in relation to an etching method for forming the etching pattern shown in FIG. 4.

FIG. 5 shows measurements of changes of a dimensional difference Pa (Pa=pattern width a−pattern width b) when dry-etching of the BARC film 4 is implemented as shown in FIG. 4, for each of a high-integration region 10, at which the pattern is densely integrated, and a low-density region 11, at which the pattern is not densely integrated. The dry-etching is conducted under the conditions described above for the case in which the flow volume ratio of $O_2$ with respect to $Cl_2$ in the etching gas is varied, with the resist pattern 5 serving as a mask. The etching conditions are:

Use of an ICP (inductively coupled plasma) etching apparatus;
Pressure=5 mTorr;
Source power=250 W;
Bottom power=70 W;
Electrode temperature=60° C.;
Gas flow: $Cl_2/O_2/He$=20/(10 to 40)/(70 to 40) (sccm), total flow 100 sccm. Over-etching is set to 50%.

At this time, the relationship between substrate RF power, corresponding to bottom power, and ion energy is shown by the aforementioned FIG. 10. The ion energy is around 72 eV.

As shown in FIG. 5, the dimensional difference Pa due to this BARC etching is dependent on the flow volume ratio of $O_2$ relative to $Cl_2$ in the etching gas ($O_2/Cl_2$), and a difference between high-density regions and low-density regions of the pattern can be observed. Basically, the dimensional difference Pa becomes greater with increases in the flow volume ratio of $O_2$, and the dimensional difference Pa is smaller for isolated patterns at the low-density region 11 than for highly integrated patterns at the high-integration region 10.

Here, because the resist film, which is an organic material including O* (oxygen radicals), and the BARC film are etched at the same time, width dimensions of the resist pattern are reduced, as shown in FIG. 4, and the dimensional difference Pa is caused. This can be thought to be because gas that causes deposition can easily enter at low-density pattern portions, as mentioned above. Because of the effects of this re-deposition, the resist pattern assumes tapered forms. Thus, a reduction of pattern widths may be difficult.

Accordingly, the dimensional difference Pa increases as the flow volume ratio of $O_2$ relative to $Cl_2$ becomes larger. If the flow volume ratio becomes excessively large, the height of the resist pattern 5 will become small, and a sufficient amount of the resist pattern for forming a fine pattern in the SiN film 3 (about 150 nm) cannot be assured. Thus, $O_2$ should not be added to excess.

According to the measurement results of FIG. 5, variations of the dimensional difference Pa at respective low- and high-density regions of the pattern can be suppressed to a relatively low level by setting the flow volume ratio of $O_2$ relative to $Cl_2$ to at least 1.0, based on the above-described etching conditions. Further, it is ascertained that dimensional differences Pa of the order of 0.025 μm to 0.03 μm can be provided at the respective regions of low and high density of the pattern, while the required height of the resist pattern 5 can be assured, by setting the flow volume ratio to around 1.5.

As has been described for the first embodiment, etching based on the above conditions hardly at all removes the underlying film, the SiN film 3.

As described above, when BARC etching is carried out according to the fabrication method of the second embodiment using gas including $O_2$ and $Cl_2$ gas, the selectivity ratio relative to the underlying film, the SiN film, can be adequately assured by setting the flow volume ratio of $O_2$ relative to $Cl_2$ appropriately. At the same time, a finer wiring pattern can be formed from the photolithography pattern.

Moreover, in the present embodiment, the underlying film is assumed to be a SiN film. However, the present invention is not limited to this. The underlying film may be a conductive material such as polySi, WSi/polySi or the like.

Third Embodiment

In this embodiment, as in the second embodiment, a BARC film is dry-etched using a gas that includes at least $O_2$ and $Cl_2$ as an etching gas. The present embodiment illustrates a method different from the etching method of the second embodiment, for a case of forming the etching pattern shown in the aforementioned FIG. 4. Details are described below.

FIG. 6 shows measurements of changes of dimensional difference Pa (Pa=pattern width a−pattern width b) when dry-etching of the BARC film 4 is implemented as shown in FIG. 4, for both the high-integration region 10, at which the pattern is densely integrated, and the low-density region 11, at which the pattern is not densely integrated. The dry-etching is conducted under the conditions described above for the case in which the ion energy is varied, with the resist pattern 5 serving as a mask. The etching conditions are:

Use of an ICP (inductively coupled plasma) etching apparatus;
Pressure=5 mTorr;
Gas flow: $Cl_2/O_2/He$=20/20/60 (sccm);
Source power=250 W;
Bottom power=20 to 100 W;
Electrode temperature=60° C. Over-etching is set to 50%.

At this time, the relationship between substrate RF power, corresponding to bottom power, and ion energy is shown by the aforementioned FIG. 10.

As shown in FIG. 6, the dimensional difference Pa due to this BARC etching is dependent on the ion energy, which changes with the RF power corresponding to the bottom power, and a difference between high-density regions and low-density regions of the pattern can be observed. Basically, the dimensional difference Pa becomes greater with reductions in ion energy, and a rate of this change of the dimensional difference Pa with the ion energy is larger for isolated patterns at the low-density region 11 than for highly integrated patterns at the high-integration region 10.

Here, because the resist film, which is an organic material including O* (oxygen radicals), and the BARC film are etched at the same time, the width dimensions of the resist pattern are reduced, as shown in FIG. 4, and the dimensional difference Pa is caused. It can be thought that, at low-density pattern portions at which gas that causes deposition can easily enter, re-deposition decreases remarkably in accordance with a reduction in ion energy.

However, if the RF power is too low, etching residue will be generated at narrow slit portions. Therefore, the RF power should not be excessively reduced.

According to the FIG. 6, variations of the dimensional difference Pa at respective low- and high-density regions of the pattern can be suppressed to a relatively low level by setting the ion energy to 50 eV (corresponding to an RF power of 50 W) or less, based on the above etching conditions. Further, if the ion energy is set to 15 eV (corresponding to an RF power of 20 W), dimensional differences Pa can be made substantially the same, at around 0.03 µm, at both the low-density regions and the high-density regions of the pattern. This value of 15 eV for the ion energy is a lower limit of values at which etching residue will not be generated.

As has been described for the first embodiment, etching based on the above conditions hardly at all removes the underlying film, the SiN film 3.

As described above, when BARC etching is carried out according to the fabrication method of the third embodiment using gas including $O_2$ and $Cl_2$ gas, the selectivity ratio relative to the underlying film, the SiN film, can be adequately assured by adjusting the ion energy. At the same time, the same effects are provided as in the second embodiment. Moreover, substantially the same dimensional differences Pa can be obtained at the respective regions, regardless of density variations of the pattern.

Furthermore, in the present embodiment, the underlying film is assumed to be a SiN film. However, the present invention is not limited to this. The underlying film may be a conductive material such as polySi, WSi/polySi or the like.

Fourth Embodiment

FIGS. 7A and 7B are explanatory diagrams systematically showing principal structure of a semiconductor device for explaining a fabrication method of a fourth embodiment according to the semiconductor device fabrication method of the present invention. FIG. 7A shows principal cross-section of steps of a resist pattern formed by photolithography. FIG. 7B shows principal cross-section of the steps after completion of dry-etching of the SiN film and ashing of the resist and the BARC, described below.

As shown in FIG. 7A, the polySi film 2, the SiN film 3, the BARC film 4 and the resist pattern 5 are formed on the substrate 1, similarly to the second embodiment.

Thereafter, the BARC film 4 is dry-etched by the same method as in the third embodiment, with an RF power (bottom power) of 20 W and with the resist pattern 5 serving as a mask. As explained above, FIG. 4 illustrates the state of the semiconductor device at the steps. Here, as is clear from the aforementioned FIG. 6, the respective dimensional differences Pa are around 0.03 µm at the respective regions of high-density and low-density of the pattern.

Then, in the same chamber as a chamber for BARC etching, dry-etching of the SiN film 3 is carried out under the following etching conditions. FIG. 7B shows the state of the steps of the semiconductor device after completion of dry-etching of the BARC film 4 and subsequent ashing of the resist and the BARC. A pattern width c of a SiN patterned film 3' corresponds to the pattern width b of the BARC pattern shown in FIG. 4. The pattern width c represents a pattern width at a lower face side of the formed SiN patterned film 3'.

Figure 8:
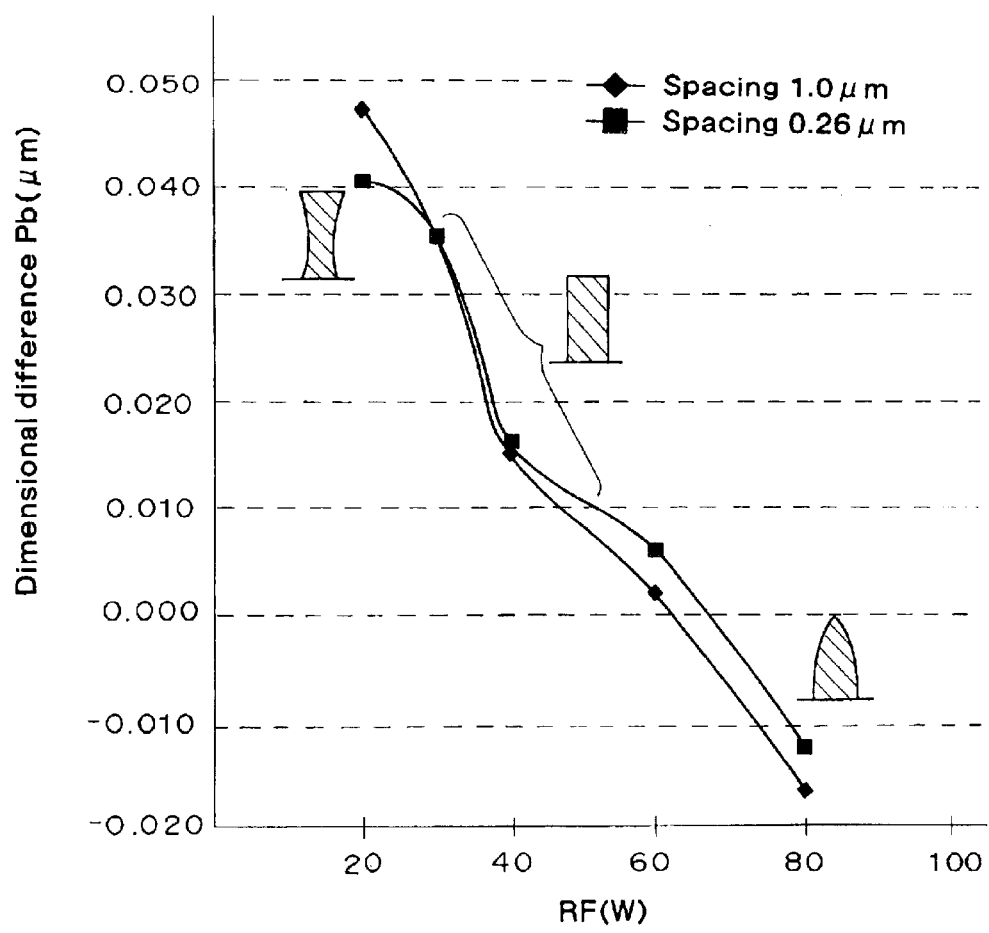
FIG. 8 is a graph showing RF power dependence characteristics of a dimensional difference Pb resulting from SiN etching.

FIG. 8 shows measurements of changes of a dimensional difference Pb (Pb=pattern width b−pattern width c) when dry-etching of the SiN film 3 is implemented for both the high-integration region 10 and the low-density region 11. The dry-etching is conducted under the following conditions with the ion energy being varied, using HBr, $CF_4$ and He for an etching gas, with the resist pattern 5 and BARC film 4 shown in FIG. 4 serving as a mask. A space d between neighboring patterns is of the order of 0.26 µm at the densely integrated high-integration region 10, and is not less than 1.0 µm at the low-density region 11. The etching conditions are:

Use of an ICP (inductively coupled plasma) etching apparatus;
Pressure=10 mTorr;
Gas flow: HBr/$CF_4$/He=20/80/100 (sccm);
Source power=600 W;
Bottom power=20 to 80 W;
Electrode temperature=60° C. Over-etching is set to 20%.

Figure 11:
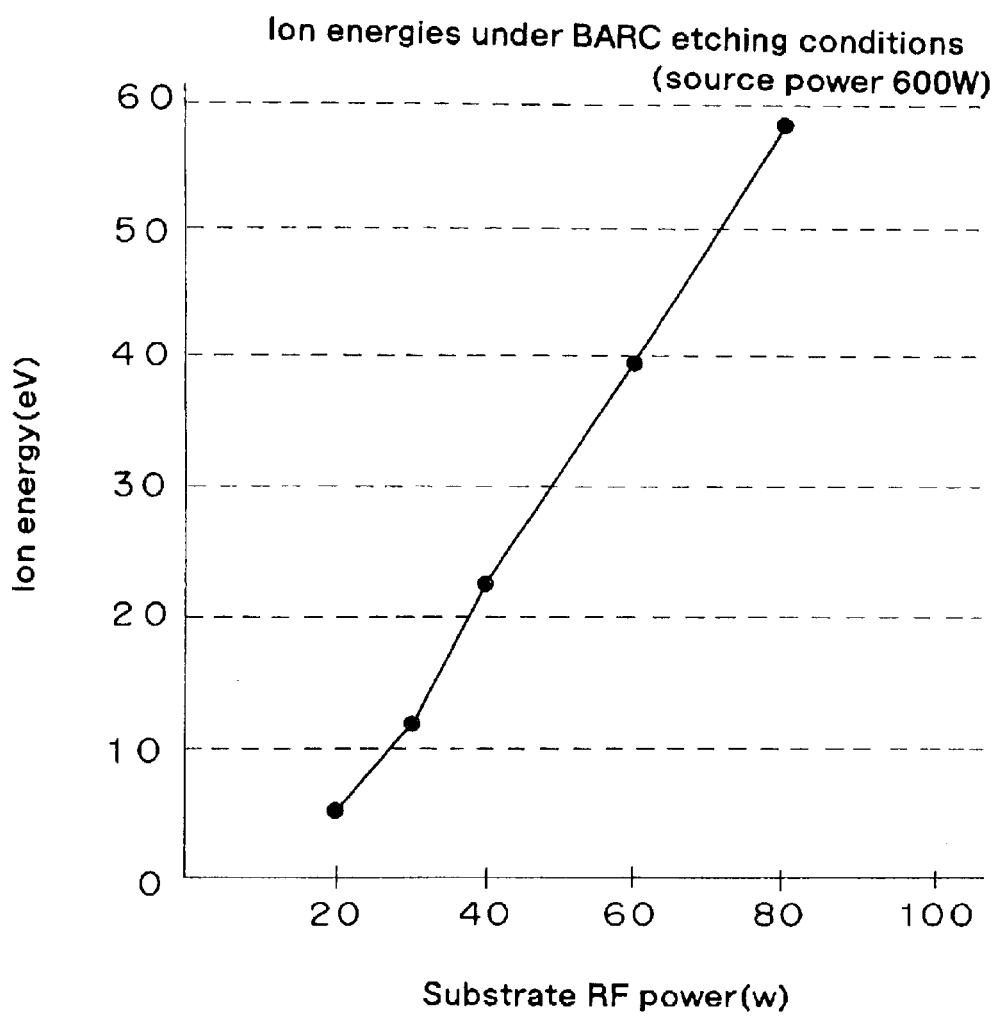
FIG. 11 is a graph showing a relationship between substrate RF power and ion energy during SiN film etching by an ICP etching apparatus using a present embodiment.
Figure 12:
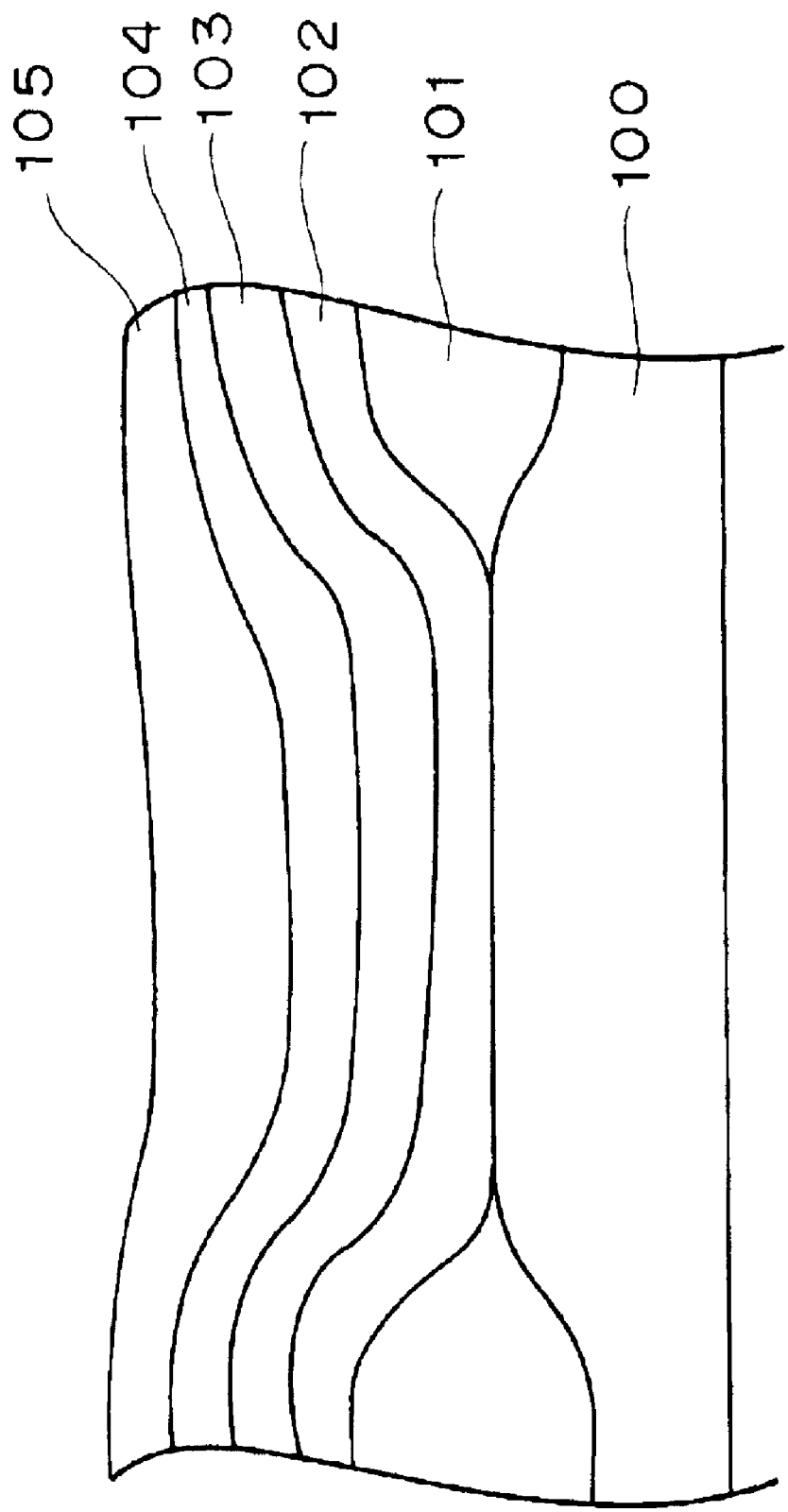
FIG. 12 shows cross-sectional variation of a gate structure having a step when a BARC film of the gate structure is etched by dry-etching with a conventional method.
Figure 13:
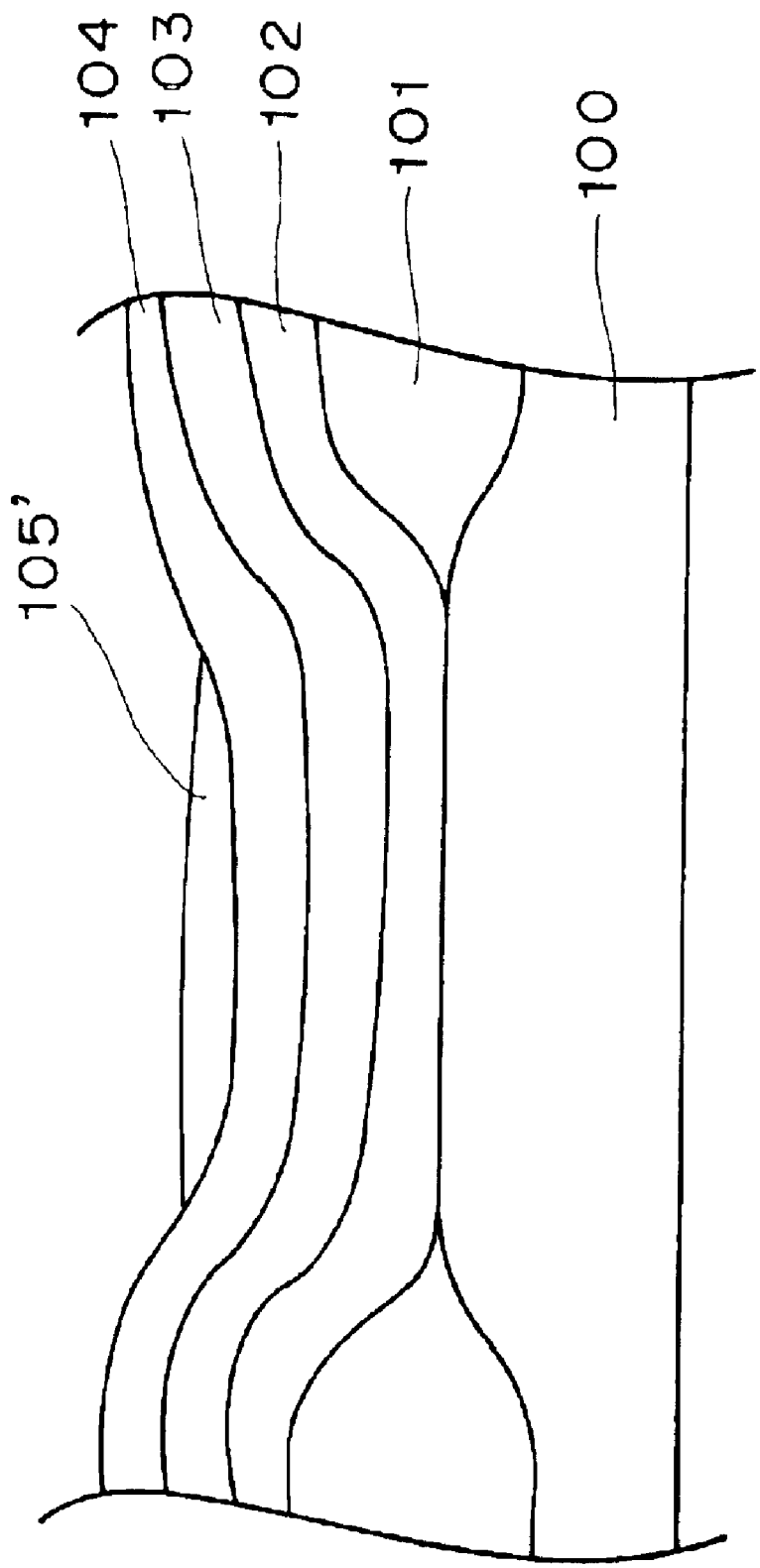
FIG. 13 shows cross-sectional variation of a gate structure having a step when a BARC film of the gate structure is etched by dry-etching with a conventional method.
Figure 14:
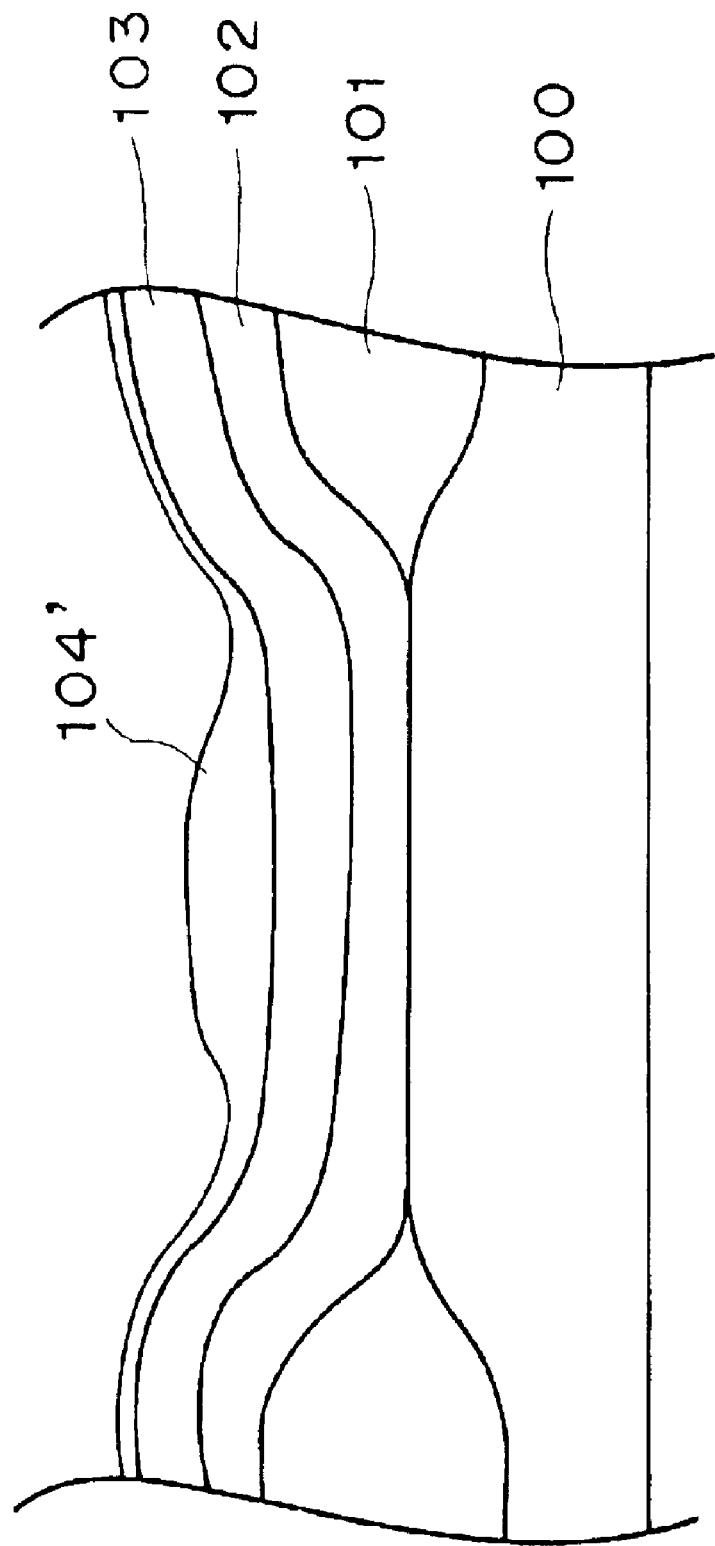
FIG. 14 shows cross-sectional variation of a gate structure having a step when a BARC film of the gate structure is etched by dry-etching with a conventional method.
Figure 15:
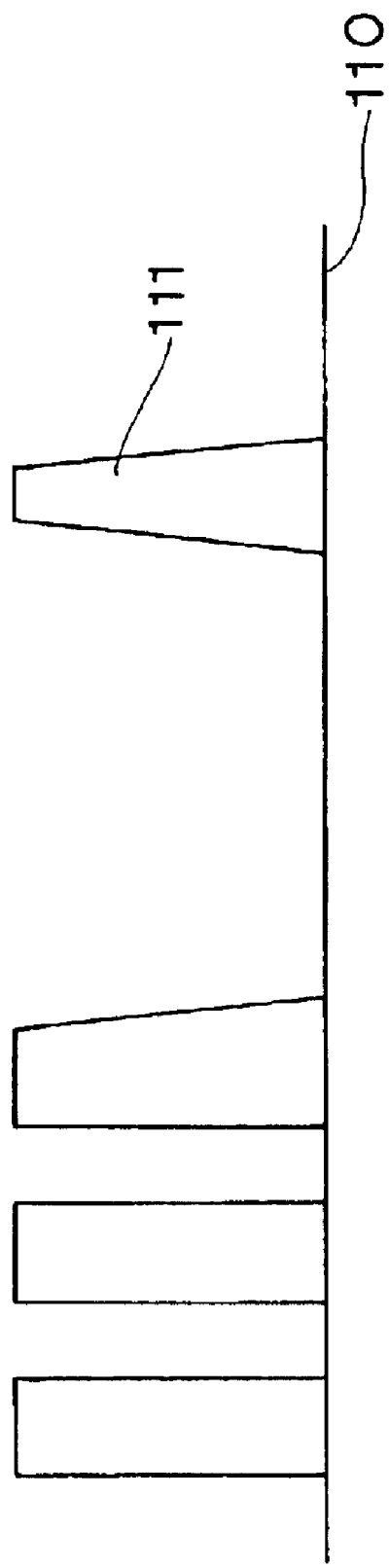
FIG. 15 is a diagram schematically showing the form of a $SiN/SiO_2$ film pattern formed by a conventional hard mask etching method.

FIG. 11 shows results of measurements of a relationship between substrate RF power, corresponding to bottom power, and ion energy during SiN film etching with an ICP etching apparatus using the present embodiment.

The ion energy also varies with RF frequency, and decreases in correspondence to an increase in the frequency. The ion energy further depends on a source power that generates plasma, and the ion energy tends to decrease as the source power is raised. The measurements were taken with RF frequency=13.16 MHz and source power=600 W.

As can be clearly seen from FIG. 11, the ion energy (eV) increases substantially in proportion to the RF power (W). Therefore, setting of the ion energy to a desired value at a time of etching can be performed by adjusting the substrate RF power of the ICP etching apparatus.

As shown in FIG. 8, the dimensional difference Pb due to this SiN etching is dependent on the ion energy, which changes with the RF power which corresponds to the bottom power, and a difference between high-density regions and low-density regions of the pattern can be observed.

That is, the dimensional difference Pb decreases with increases in ion energy, and the pattern width c formed by the etching increases accordingly. This can be thought to be because, when the ion energy increases, a re-attaching component of the resist increases, side wall portions of the etched portions are protected thereby, and the pattern cross-section is thus formed in tapered shapes as shown in FIG. 8.

Furthermore, when the RF power is raised, selectivity with respect to the SiN patterned film 3' falls and masking of the resist pattern 5 over the SiN patterned film 3' (FIG. 4) is nullified. If the RF power is 80 W (the ion energy is about 58 eV), top portions of the SiN patterned film 3' will be formed to be tapered, as shown in FIG. 8.

On the other hand, when the ion energy falls, the dimensional difference Pb increases in correspondence with this fall. Consequently, it can be seen that a pattern width c formed by the etching will be reduced. In this case, selectivity of the resist relative to the SiN patterned film 3' becomes larger, and there is no need for concern about tapering of upper face portions of the SiN patterned film 3'. However, side wall-protecting components due to re-attaching components from the resist are reduced, and if the power is 20 W (the ion energy is around 5 eV), the side walls will be formed convexly as shown in FIG. 8.

If the RF power is excessively reduced, etching residue will be generated at slit portions where the pattern spacing is narrow, and an etching margin will be reduced.

If, in the etching conditions of the present embodiment, the ion energy is of the order of 23 eV (corresponding to a substrate RF power of 40 W), the SiN patterned film 3' is etched vertically as shown in FIG. 8, and the dimensional difference Pb is around 0.015 μm at both high- and low-density regions of the pattern. Thus, most preferable dry-etching can be performed.

Here, by performing etching under the conditions described above and with an ion energy in a range from 13 eV to 30 eV (corresponding to a substrate RF power of 30 W to 50 W), the SiN patterned film 3' can be formed substantially vertically, and fine adjustments can be performed while the dimensional difference Pb is assured of having substantially equal values at respective low-density and high-density regions of the pattern.

As described above, when etching is carried out according to the fabrication method of the fourth embodiment with the ion energy adjusted to within a predetermined range, vertical etching of the SiN film can be implemented, regardless of density variations of the pattern.

Moreover, because the dimensional difference Pb changes with changes in the substrate RF power, pattern dimensions of the SiN film etching can be adjusted finely by adjustment of the RF power. Furthermore, the dry-etching of the SiN film can be implemented in the same chamber as BARC etching.

Fifth Embodiment

This embodiment, which is explained below, relates to an etching method different from that of the fourth embodiment. Similarly to the fourth embodiment, a SiN film is dry-etched using HBr, $CF_4$ and He for etching gas, and an etching pattern is formed as shown in the aforementioned FIGS. 7A and 7B.

Figure 9:
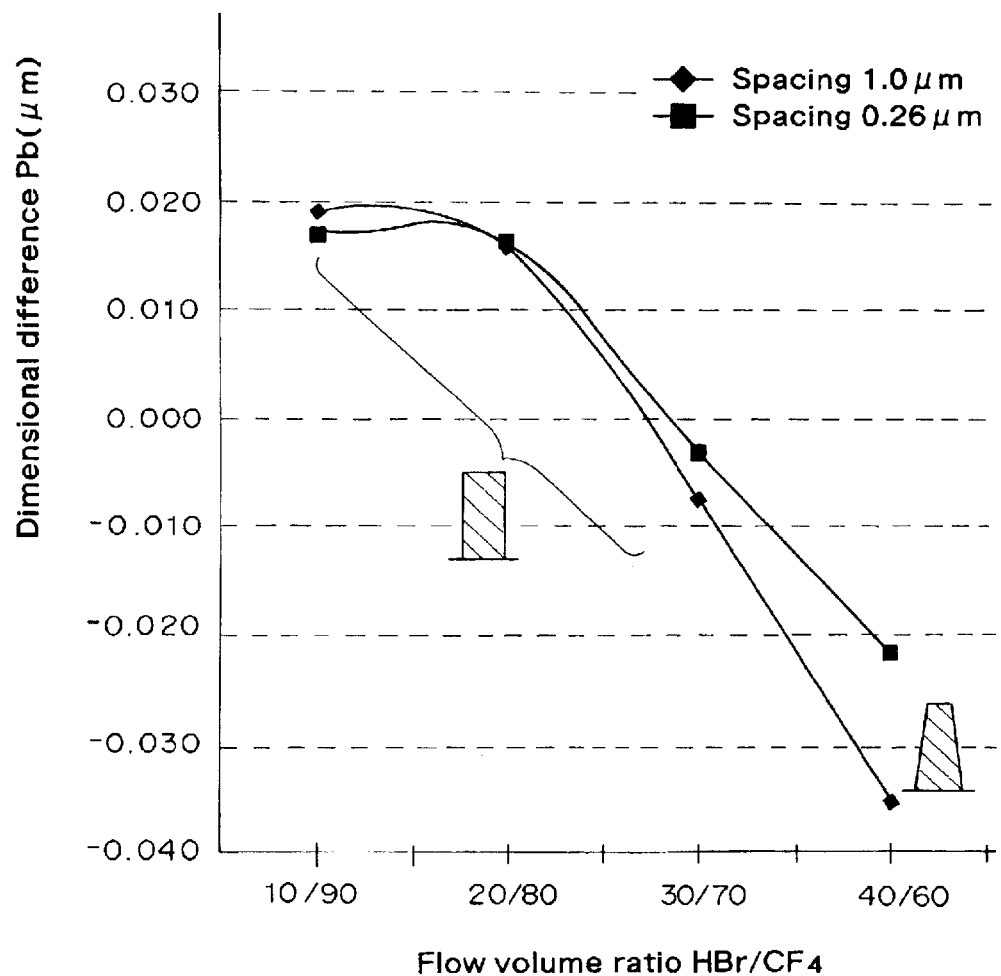
FIG. 9 is a graph showing HBr flow volume ratio dependence characteristics of a dimensional difference Pb resulting from SiN etching.

FIG. 9 shows measurements of changes of the dimensional difference Pb (Pb=pattern width b–pattern width c) when dry-etching of the SiN film 3 is implemented for both the high-integration region 10 and the low-density region 11. The dry-etching is conducted under the following conditions with a flow volume ratio of HBr relative to $CF_4$ in the etching gas being varied, with the resist and BARC pattern serving as a mask. The pattern is spaced at around 0.26 μm at the densely integrated high-integration region 10, and around 1.0 μm at the low-density region 11. The etching conditions are:

Use of an ICP (inductively coupled plasma) etching apparatus;
Pressure=10 mTorr;
Source power=600 W;
Bottom power=40 W;
Electrode temperature=60° C.;
Gas flow: HBr/$CF_4$/He=(10 to 40)/(90 to 60)/100 (sccm), total flow 200 sccm (fixed). Over-etching is set to 20%.

The relationship between substrate RF power, corresponding to bottom power, and ion energy at this time is shown in FIG. 11, and the ion energy is about 23 eV.

As shown in FIG. 9, the dimensional difference Pb resulting from this SiN etching depends on a flow volume ratio of HBr relative to $CF_4$ in the etching gas (HBr/$CF_4$), and it can be seen that there is a difference between high-density regions and low-density regions of the pattern.

That is, the dimensional difference Pb decreases with increases in the flow volume ratio of HBr, and the pattern width c formed by the etching increases accordingly. This can be thought to be because, when the flow volume ratio of HBr increases, $SiBr_4$, which is a reaction product, acts to protect side wall portions of the etched portions, and thus the pattern cross-section is formed in tapered shapes as shown in FIG. 9.

Furthermore, the dependence of the dimensional difference Pb on the density variations of the pattern is such that when the flow volume ratio is raised, the rate of decrease of the dimensional difference Pb at low-density regions is larger. This can be thought to be due to greater ease of enter of the $SiBr_4$ reaction product at the low-density regions, so that side wall portions of the etching pattern are more protected at low-density regions, and have a greater tendency to become tapered.

Thus, by performing etching under the etching conditions of the present embodiment and with a flow volume ratio HBr/$CF_4$, in a HBr/$CF_4$/He gas, set to be in a range from 0.1 to 0.4, the SiN can be formed substantially vertically, as shown in FIG. 9. Further, the dimensional difference Pb can be set to near zero for both high-density and low-density regions of the pattern by setting the flow volume ratio HBr/$CF_4$ to around 0.35.

As described above, when etching is carried out according to the fabrication method of the fifth embodiment with the flow volume ratio of HBr relative to $CF_4$ in a HBr/$CF_4$/He gas adjusted in a predetermined range, vertical etching of the SiN film can be implemented, regardless of density variations of the pattern. Moreover, the dimensional difference Pb can be set to near zero for both high-density and low-density regions of the pattern by setting the flow volume ratio HBr/$CF_4$ in the predetermined range.

What is claimed is:

1. A semiconductor device fabrication method including etching a BARC film disposed with an underlying SiN or polySi film, the etching comprising:

dry-etching the BARC film with an etching gas which is formed by mixing a plurality of gases including at least $O_2$, $Cl_2$ and He at predetermined flow volume ratios; and during said dry-etching the BARC film with the etching gas, increasing an etching selectivity ratio of the BARC film relative to the underlying film by increasing the flow volume ratio of $O_2$ relative to $Cl_2$.

2. The semiconductor device fabrication method of claim 1, wherein the flow volume ratio of $O_2$ relative to $Cl_2$ is increased to substantially 1.5.

3. A semiconductor device fabrication method including etching a BARC film disposed with an underlying SiN or polySi film, the etching comprising:

dry-etching the BARC film with an etching gas which is formed by mixing a plurality of gases including at least $O_2$, $Cl_2$ and He at predetermined flow volume ratios; and during said dry-etching the BARC film with the etching gas, increasing an etching selectivity ratio of the BARC film relative to the underlying film by reducing ion energy of said dry-etching.

4. The semiconductor device fabrication method of claim 3, wherein the flow volume ratio of $O_2$ relative to $Cl_2$ in the etching gas is set to substantially 1.5.

5. A semiconductor device fabrication method including etching a BARC film disposed with an underlying SiN or polySi film, the etching comprising:

dry-etching the BARC film with an etching gas which is formed by mixing a plurality of gases including at least $O_2$, $Cl_2$ and He at predetermined flow volume ratios; and during said dry-etching the BARC film with the etching gas, increasing the flow volume ratio of $O_2$ relative to $Cl_2$ in the etching gas to at least 1.

6. The semiconductor device fabrication method of claim 5, wherein an ion energy during etching is set to 50 eV or less.

7. The semiconductor device fabrication method of claim 6, wherein a substrate RF power of the semiconductor device is adjusted when the ion energy is set.

8. The semiconductor device fabrication method of claim 5, wherein an ion energy during etching is set to substantially 15 eV.

9. The semiconductor device fabrication method of claim 8, wherein a substrate RF power of the semiconductor device is adjusted when the ion energy is set.

10. The semiconductor device fabrication method of claim 5, wherein the flow volume ratio of $O_2$ relative to $Cl_2$ in the etching gas is set to substantially 1.5.

11. A semiconductor device fabrication method including etching a SiN film which is to be patterned so as to include both a high-density region and a low-density region, the etching comprising:

etching the SiN film using an etching gas in which HBr, $CF_4$ and He are mixed in predetermined flow volume ratios; and setting an ion energy at the time of said etching in a range from 13 eV to 30 eV.

12. The semiconductor device fabrication method of claim 11, wherein the ion energy at the time of etching is set to substantially 23 eV.

13. The semiconductor device fabrication method of claim 12, wherein adjusting a substrate RF power of the semiconductor device is adjusted when the ion energy is set.

14. The semiconductor device fabrication method of claim 11, wherein the flow volume ratio of HBr relative to $CF_4$ in the etching gas is set in a range from 0.1 to 0.4.

15. The semiconductor device fabrication method of claim 14, wherein the flow volume ratio of HBr relative to $CF_4$ in the etching gas is set to substantially 0.35.

* * * * *